United States Patent
Huh et al.

(10) Patent No.: US 11,411,651 B2
(45) Date of Patent: Aug. 9, 2022

(54) BIDIRECTIONAL OPTICAL TRANSCEIVER MODULE

(71) Applicant: ELECTRONICS AND TELECOMMUNICATIONS RESEARCH INSTITUTE, Daejeon (KR)

(72) Inventors: Joon Young Huh, Daejeon (KR); Sae-Kyoung Kang, Daejeon (KR); Sanghwa Yoo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/204,341

(22) Filed: Mar. 17, 2021

(65) Prior Publication Data
US 2021/0297158 A1    Sep. 23, 2021

(30) Foreign Application Priority Data
Mar. 19, 2020   (KR) .......................... 10-2020-0033848

(51) Int. Cl.
*H04B 10/00*    (2013.01)
*H04B 10/40*    (2013.01)
(Continued)

(52) U.S. Cl.
CPC .............. *H04B 10/40* (2013.01); *G02B 1/11* (2013.01); *G02B 27/30* (2013.01); *H05K 9/0081* (2013.01)

(58) Field of Classification Search
CPC ..... H04B 10/40; H04B 10/2507; H04J 14/02; G02B 6/2938; G02B 6/4246;
(Continued)

(56) References Cited

U.S. PATENT DOCUMENTS 6,941,047 B2 *  9/2005  Capewell ........... G02B 6/29367
                                                            385/47
8,641,298 B2 *  2/2014  Lim ..................... G02B 6/4246
                                                            385/14
(Continued)

FOREIGN PATENT DOCUMENTS

JP      2017-529552 A     10/2017
KR   10-2019-0098665 A     8/2019

OTHER PUBLICATIONS

Koichiro Masuko et al., "A Low Cost PON Transceiver using Single TO-CAN Type micro-BOSA", 2006 Electronics Components and Technology Conference 1082-1086p.
(Continued)

*Primary Examiner* — Hanh Phan
(74) *Attorney, Agent, or Firm* — LRK Patent Law Firm

(57) ABSTRACT

A bidirectional optical transceiver module includes an optical Tx block including a light source configured to output an optical Tx signal; an optical Rx block provided in parallel to the optical Tx block and including a PD configured to receive an optical Rx signal; a wavelength distributor configured to change a travel path of the optical Tx signal; an optical filter provided on a predetermined area of a first surface of the wavelength distributor adjacent to the optical Tx or Rx block and configured to transmit the optical Rx signal and reflect the optical Tx signal; a first lens provided between the optical Tx block and the wavelength distributor; a second lens provided between the optical Rx block and the wavelength distributor; and a third lens configured to output the optical Tx signal to outside and output the optical Rx signal from the outside to the wavelength distributor.

11 Claims, 8 Drawing Sheets

(51) Int. Cl.
*G02B 1/11* (2015.01)
*H05K 9/00* (2006.01)
*G02B 27/30* (2006.01)

(58) Field of Classification Search
CPC .. G02B 6/4249; G02B 6/4215; G02B 6/4214;
G02B 6/29365; G02B 6/29367
USPC ... 398/135, 136, 137, 138, 139, 164, 79, 87,
398/158, 159, 128, 127, 130, 201, 202,
398/208, 209, 212; 385/24, 37, 88, 89,
385/90, 92, 93
See application file for complete search history.

(56) References Cited

U.S. PATENT DOCUMENTS

| | | | |
|---|---|---|---|
| 2004/0234270 A1* | 11/2004 | Nishie | G02B 6/4246 |
| | | | 398/141 |
| 2011/0058771 A1* | 3/2011 | Lee | G02B 6/4215 |
| | | | 385/33 |
| 2014/0061451 A1 | 3/2014 | Park et al. | |
| 2014/0099055 A1 | 4/2014 | Chen et al. | |
| 2015/0372759 A1 | 12/2015 | Lim et al. | |
| 2020/0044738 A1* | 2/2020 | Leigh | H04J 14/06 |

OTHER PUBLICATIONS

Jong Jin Lee et al., Single package directly modulated laser bidirectional optical subassembly using a modified mini-dual-in-line package for 10 Gbps passive optical networks, Dec. 2012, vol. 51, Optical Engineering Letter.

* cited by examiner

Glass block

BIDIRECTIONAL OPTICAL TRANSCEIVER MODULE

CROSS-REFERENCE TO RELATED APPLICATION(S)

This application claims the priority benefit of Korean Patent Application No. 10-2020-0033848 filed on Mar. 19, 2020, in the Korean Intellectual Property Office, the disclosure of which is incorporated herein by reference for all purposes.

BACKGROUND

1. Field of the Invention

One or more example embodiments relate to a structure of a bidirectional optical transceiver module used for optical communication.

2. Description of Related Art

An optical network for individual subscribers is called an optical subscriber network. In general, a bidirectional optical transceiver module in which an optical transmitter and an optical receiver are integrated in a single package and only a single optical fiber is used for an input/output port is widely used in the optical network. The bidirectional optical transceiver module commercialized so far is 10G and is mainly developed in a form of TO-CAN.

In general, the mass productivity of an optical transceiver module greatly depends on packaging difficulty of embedded optical devices and electronic devices. In the bidirectional optical transceiver module, a light source that is a light emitting device and a photodiode that is a light receiving device are used together and a light emission direction of the light source and a light receiving direction of the PD are perpendicular to each other. However, in the bidirectional optical transceiver module, the light source and the PD need to share an input/out port. Therefore, when the light emission direction of the light source and the light receiving direction of the PD are perpendicular to each other, a structure of the bidirectional optical transceiver module may become complex, which may lead to decreasing the mass productivity.

SUMMARY

One or more example embodiments provide a bidirectional optical transceiver module and more particularly, provide a structure of the bidirectional optical transceiver module that may lower a process difficulty by providing a light source disposed within the optical transceiver module and a lens used for a photodiode (PD) to be parallel to each other and improve economic efficiency.

According to an aspect, there is provided a bidirectional optical transceiver module including an optical transmission (Tx) block including a light source configured to output an optical Tx signal; an optical reception (Rx) block provided in parallel to the optical Tx block at a predetermined interval therefrom and including a photodiode (PD) configured to receive an optical Rx signal; a wavelength distributor configured to change a travel path of the optical Tx signal; an optical filter provided on a predetermined area of a first surface of the wavelength distributor adjacent to the optical Tx block or the optical Rx block and configured to transmit the optical Rx signal and to reflect the optical Tx signal; a first lens provided between the optical Tx block and the wavelength distributor; a second lens provided in parallel to the first lens between the optical Rx block and the wavelength distributor; and a third lens configured to output the optical Tx signal passing through the wavelength distributor to an outside and to output the optical Rx signal received from the outside to the wavelength distributor. The optical Tx signal output from the light source of the optical Tx block is converted to a form of a collimated beam through the first lens, incident to the wavelength distributor, reflected by a reflector provided on a predetermined area of a second surface that faces the first surface of the wavelength distributor and then reflected again by the optical filter and output to the outside through the third lens, and the optical Rx signal received from the outside is received at the wavelength distributor through the third lens, transmitted through the optical filter, and received at the PD of the optical Rx block through the second lens.

The optical Tx signal and the optical Rx signal may have different wavelengths.

The bidirectional optical transceiver module may further include a collimated light divergence suppression block configured to improve optical coupling efficiency to the second lens by suppressing divergence of the optical Rx signal output through the optical filter, when a distance between the second lens and the optical filter is greater than or equal to a preset reference due to a difference in a physical length between electrical devices that constitute the optical Tx block and the optical Rx block. The collimated light divergence suppression block may be provided between the second lens and the optical filter and may include a transparent device having a higher refractive index than that of air.

The collimated light divergence suppression block may be configured to control an optical path of the optical Rx signal through a tilt function.

The bidirectional optical transceiver module may further include an electro-magnetic interference (EMI) suppression block configured to block effect by an electrical signal between the optical Tx block and the optical Rx block.

The bidirectional optical transceiver module may further include an optical path controller configured to change optical paths of the optical Tx signal and the optical Rx signal at a rear end of the second surface of the wavelength distributor.

A shape and a size of the optical path controller may be determined based on a position of an input/output port of the bidirectional optical transceiver module required and high reflection (HR) coating and anti-reflection (AR) coating may be applied to the respective surfaces of the optical path controller.

According to an aspect, there is provided a bidirectional optical transceiver module including an optical Tx block including a light source configured to output an optical Tx signal; an optical Rx block provided in parallel to the optical Tx block at a predetermined interval therefrom and including a PD configured to receive an optical Rx signal; a wavelength distributor configured to change a travel path of the optical Tx signal; an optical filter provided on a predetermined area of a first surface of the wavelength distributor adjacent to the optical Tx block or the optical Rx block and configured to transmit the optical Rx signal and to reflect the optical Tx signal; a first lens provided between the optical Tx block and the wavelength distributor; a second lens provided in parallel to the first lens between the optical Rx block and the wavelength distributor; a third lens configured to output the optical Tx signal passing through the wavelength distributor to an outside and to output the optical Rx signal received from the outside to the wavelength distributor; a collimated light divergence suppression block configured to improve optical coupling efficiency to the second lens by suppressing divergence of the optical Rx signal output through the optical filter, when a distance between the second lens and the optical filter is greater than or equal to a preset reference due to a difference in a physical length between electrical devices that constitute the optical Tx block and the optical Rx block; an EMI suppression block configured to block effect by an electrical signal between the optical Tx block and the optical Rx block; and an optical path controller configured to change optical paths of the optical Tx signal and the optical Rx signal at a rear end of a second surface of the wavelength distributor. The optical Tx signal output from the light source of the optical Tx block may be converted to a form of a collimated beam through the first lens, incident to the wavelength distributor, reflected by a reflector provided on a predetermined area of the second surface that faces the first surface of the wavelength distributor and then reflected again by the optical filter and output to the outside through the third lens, and the optical Rx signal received from the outside may be received at the wavelength distributor through the third lens, transmitted through the optical filter, and received at the PD of the optical Rx block through the second lens.

The optical Tx signal and the optical Rx signal may have different wavelengths.

The collimated light divergence suppression block may be provided between the second lens and the optical filter and may include a transparent device having a higher refractive index than that of air.

The collimated light divergence suppression block may be configured to control an optical path of the optical Rx signal through a tilt function.

A shape and a size of the optical path controller are determined based on a position of an input/output port of the bidirectional optical transceiver module required and HR coating and AR coating are applied to the respective surfaces of the optical path controller.

According to example embodiments, it is possible to provide a bidirectional optical transceiver module, and more particularly, to lower a process difficulty by providing a light source disposed within the optical transceiver module and a lens used for a PD to be parallel to each other and to improve economic efficiency.

Also, according to example embodiments, it is possible to suppress an electrical interference phenomenon between an optical Tx block and an optical Rx block through an EMI suppression block and to improve optical coupling efficiency of a bidirectional optical transceiver module through an optical path controller.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings, of which.

DETAILED DESCRIPTION OF THE INVENTION

Hereinafter, example embodiments are described with reference to the accompanying drawings.

Figure 1:
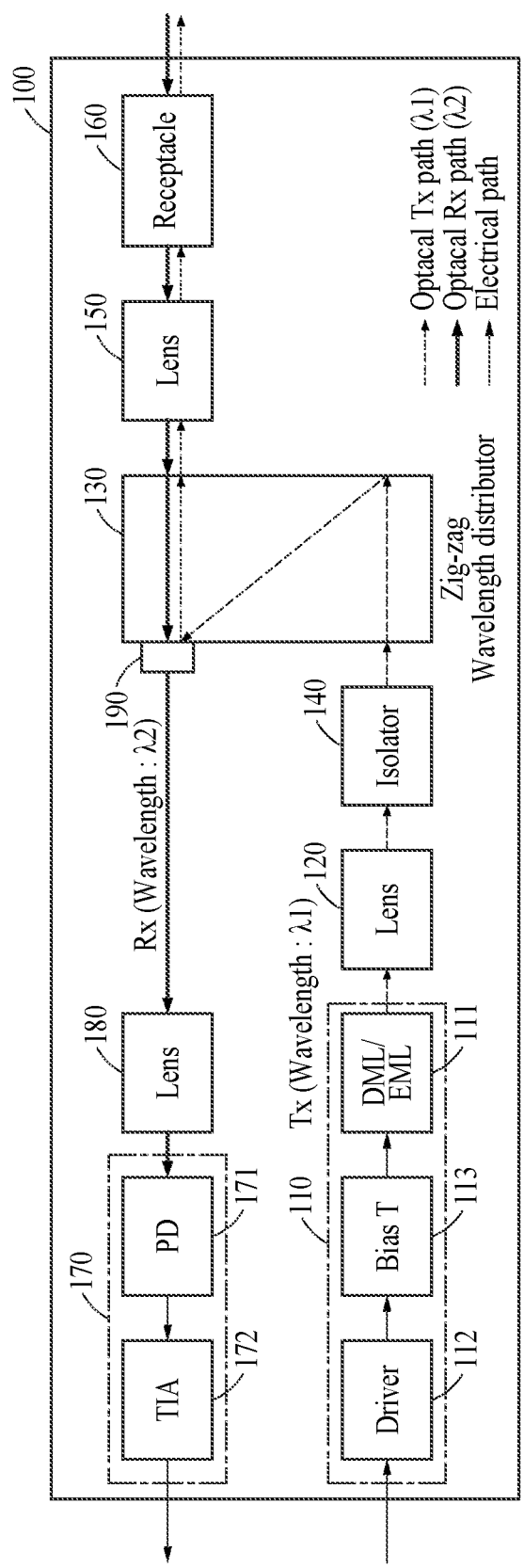
FIG. 1 is a functional block diagram illustrating an example of a bidirectional optical transceiver module according to an example embodiment.

FIG. 1 is a functional block diagram illustrating an example of a bidirectional optical transceiver module according to an example embodiment.

A bidirectional optical transceiver module 100 herein proposes a structure of integrating various optical devices in a box package. Referring to FIG. 1, a light source 111 configured to output an optical Tx signal, a driver 112 configured to drive the light source 111, and a bias device (bias T) 113 may be embedded in an optical Tx block 110 of the bidirectional optical transceiver module 100. Here, the light source 111 may be, for example, a direct modulated laser (DML) or an electro-absorption modulated laser (EML). In detail, the optical Tx signal output from the light source 111 of the optical Tx block 110 may be collimated through a first lens 120 and then applied to a wavelength distributor 130 through an optical isolator 140. Here, since a reflector is formed on one side of the wavelength distributor 130, the wavelength distributor 130 may change an optical path of the incident optical Tx signal in a zigzagged manner of FIG. 1. The optical Tx signal with the changed optical path may pass through a third lens 150 provided at a rear end of the wavelength distributor 130 and may be transmitted to an outside through a receptacle 160.

A photodiode (PD) 171 configured to receive an optical Rx signal and to convert the optical RX signal to an electrical signal and a trans-impedance amplifier (TIA) 172 configured to amplify the electrical signal output through the PD 171 may be embedded in an optical Rx block 170 of the bidirectional optical transceiver module 100. In detail, the optical Rx signal received from the outside may be incident to the wavelength distributor 130 through the third lens 150 and the optical Rx signal output by passing through the wavelength distributor 130 may be collected at a second lens 180 and applied to the PD 171. The optical Rx signal applied to the PD 171 may be converted to an electrical signal and amplified through the TIA 172 and then output.

Figure 2:
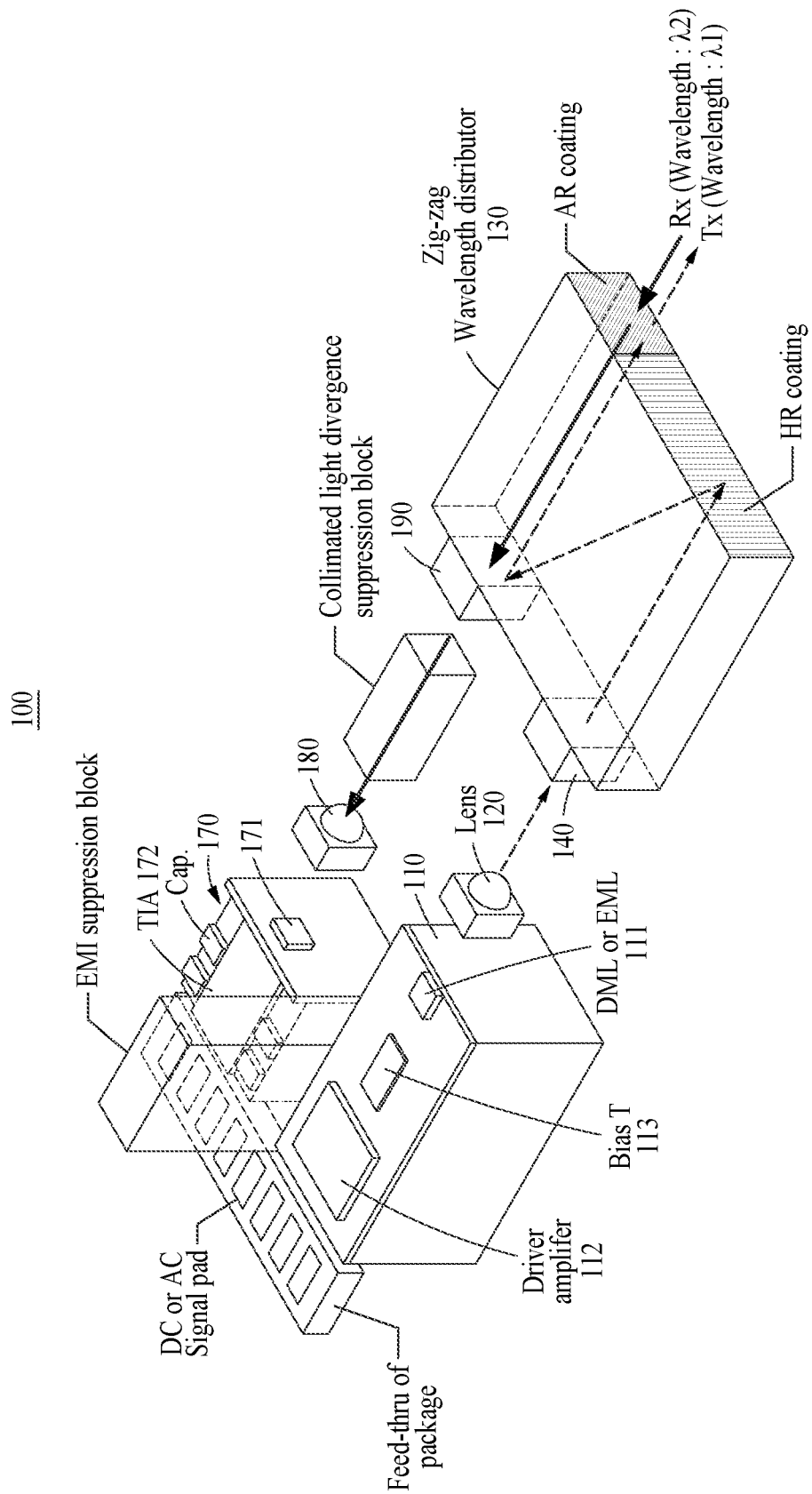
FIG. 2 illustrates an example of a bidirectional optical transceiver module according to an example embodiment.

FIG. 2 illustrates an example of a bidirectional optical transceiver module according to an example embodiment.

Referring to FIG. 2, the bidirectional optical transceiver module 100 proposed herein may include the optical Tx block 110 configured to output an optical Tx signal. Here, the optical Tx block 110 may include the light source 111, the driver 112, such as, for example, a driver amplifier, configured to drive the light source 111, and the bias T 113 on the same plane.

The first lens 120 may be provided at a rear end of the optical Tx block 110 at the same height as that of the light source 111. The first lens 120 may align the optical Tx signal output through the light source 111 of the optical Tx block 110 in a form of a collimated beam. Here, the first lens 120 may be a collimating lens.

The wavelength distributor 130 capable of changing a travel path of the optical Tx signal may be provided at a rear end of the first lens 120. Here, since a reflective surface is formed on a portion of a corresponding surface in the travel path of the optical Tx signal, the wavelength distributor 130 may reflect the optical Tx signal through the reflective surface and thereby change the travel path of the optical Tx signal. For example, the optical path may be changed by applying high reflection (HR) coating on the reflective surface of the wavelength distributor 130 and thereby reflecting the incident optical Tx signal.

The bidirectional optical transceiver module 100 may include the optical isolator 140 between the first lens 120 and the wavelength distributor 130. The optical isolator 140 may serve to block an optical signal received from the outside and reflected to the light source 111. For example, the optical isolator 140 may block an optical signal acquired by reflecting the optical Tx signal output from the light source 111 by the reflective surface of the wavelength distributor 130. The optical isolator 140 may be mounted on an output side of the first lens 120 or may be mounted on the same substrate as that of the wavelength distributor 130.

The third lens 150 configured to output the optical Tx signal to the outside and to output the optical Rx signal received from the outside to the wavelength distributor 130 may be provided at the rear end of the wavelength distributor 130. The optical Tx signal and the optical Rx signal may be connected to the outside through the receptacle 160.

The bidirectional optical transceiver module 100 may include the optical Rx block 170 provided in parallel to the optical Tx block 110 at a predetermined interval therefrom and configured to receive the optical Rx signal. Here, the optical Rx block 170 may include the PD 171 configured to receive the optical Rx signal and to convert the same to the electrical signal and the TIA 172 configured to amplify the electrical signal output through the PD 171.

The bidirectional optical transceiver module 100 proposed herein may provide the respective lenses used for the light source 111 and the PD 171 to be parallel to each other for mass production yield and economical process cost. To this end, a light emission direction of the light source 111 and a light receiving direction of the PD 171 need to be adjusted in the same direction. The PD 171 provided herein may be vertically attached based on a pattern on the side of a sub-mount of FIG. 2.

The second lens 180 configured to condense the optical Rx signal received by passing through the wavelength distributor 130 and to optically couple the optical Rx signal to the PD 171 through optical alignment may be provided at a rear end of the optical Rx block 170. Here, the second lens 180 may be a focusing lens.

An optical filter 190 configured to transmit the optical Rx signal and to reflect the optical Tx signal may be provided between the optical Rx block 170 and the wavelength distributor 130. In detail, the optical filter 190 may have a wavelength transmission bandwidth that allows only a wavelength corresponding to the optical Rx signal to pass and an optical signal, for example, the optical Tx signal, having a wavelength aside from the corresponding wavelength transmission bandwidth may be reflected.

Therefore, in the bidirectional optical transceiver module 100 provided herein, the optical Tx signal output through the light source 111 and the optical Rx signal received through the PD 171 may have different wavelengths. The optical Tx signal and the optical Rx signal having different wavelengths may be multiplexed through the wavelength distributor 130 in a zigzagged form and output.

That is, the optical Tx signal output from the light source 111 of the optical Tx block 110 may be converted to a form of a collimated beam through the first lens 120, incident to the wavelength distributor 130, reflected by the reflective surface of the wavelength distributor 130 and then reflected again by the optical filter 190 and output to the outside through the third lens 150.

Dissimilarly, the optical Rx signal received from the outside may be incident to the wavelength distributor 130 through the third lens 150, transmitted through the optical filter 190, and received at the PD 171 of the optical Rx block 170 through the second lens 180. The optical Rx signal received as above may be converted to the electrical signal by the PD 171 and may be amplified through the TIA 172 and output.

The bidirectional optical transceiver module 100 may further include an electro-magnetic interference (EMI) suppression block and a collimated light divergence suppression block, which are further described with reference to the following drawings.

Figure 3A:
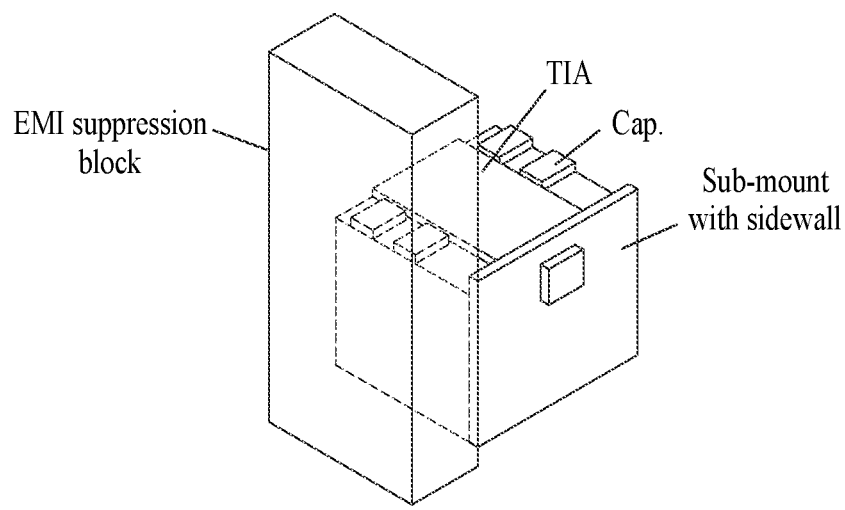
FIGS. 3A and 3B illustrate arrangement examples of an electro-magnetic interference (EMI) suppression block according to an example embodiment.
Figure 3B:
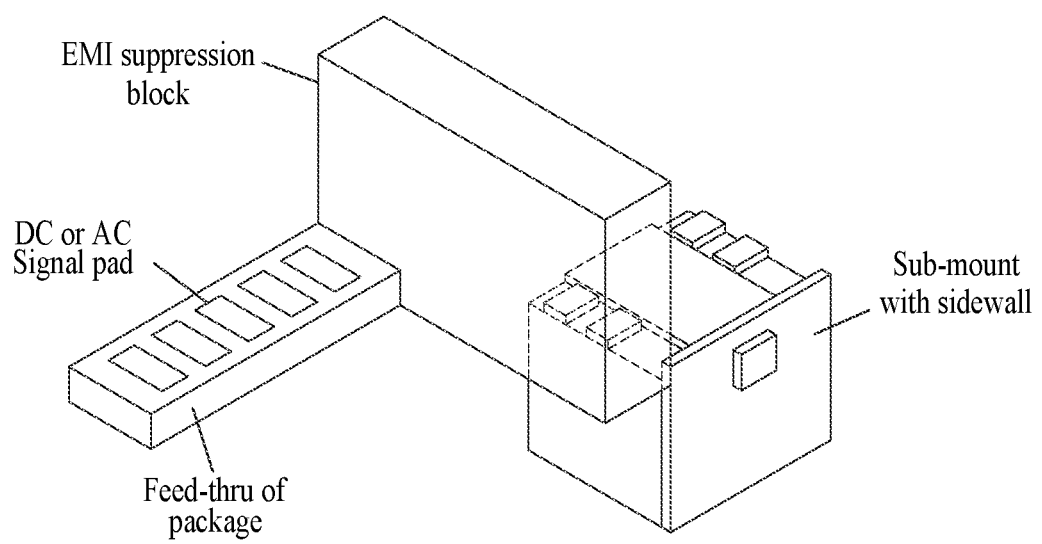

FIGS. 3A and 3B illustrate arrangement examples of an EMI suppression block according to an example embodiment.

Referring to FIG. 2, the optical Tx block 110 and the optical Rx block 170 may be provided in parallel to each other at a predetermined interval. Here, the optical Tx block 110 may be embedded with the driver 112 configured to drive the light source 111 and the bias T 113. Here, an electrical signal generated in the corresponding devices may greatly affect the optical Rx block 170.

To suppress the effect of such electrical signal, the bidirectional optical transceiver module 100 may apply the EMI suppression block. Referring to FIG. 3A, the EMI suppression block may connect to a metal of bench (MoB) of one of the optical Tx block 110 and the optical Rx block 170. Alternatively, referring to FIG. 3B, the EMI suppression block may be provided to connect to a feed-thru of a package. The EMI suppression block may be formed of, for example, a metal plate and may suppress crosstalk between the optical Tx block 110 and the optical Rx block 170.

Figure 4:
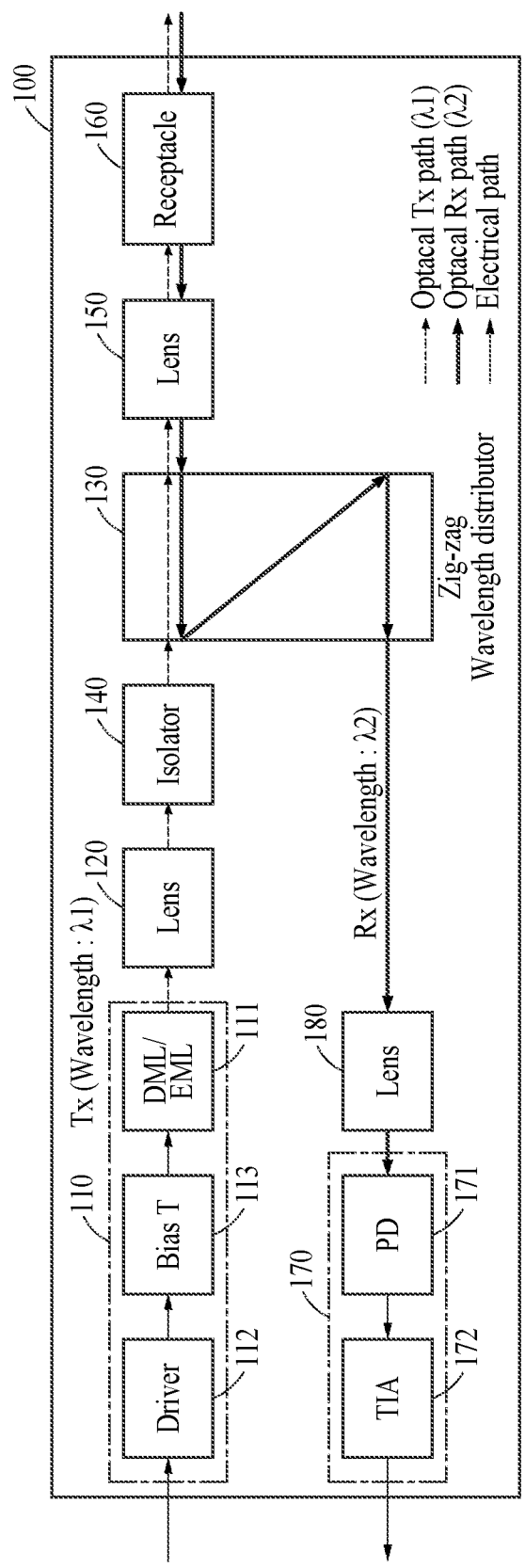
FIG. 4 is a functional block diagram illustrating another example of a bidirectional optical transceiver module according to an example embodiment.

FIG. 4 is a functional block diagram illustrating another example of a bidirectional optical transceiver module according to an example embodiment.

FIG. 4 illustrates a structure in which positions of an optical Tx block 110 and an optical Rx block 170 are inverted based on a wavelength distributor 130 in the functional block diagram of the bidirectional optical transceiver module 100 of FIG. 1. Therefore, FIG. 1 illustrates a structure in which an optical path of an optical Tx signal output through an optical Tx block 110 is longer than an optical path of an optical Rx signal received through an optical Rx block 170, and FIG. 4 illustrates a structure in which an optical path of an optical Rx signal received through an optical Rx block 170 is longer than an optical path of an optical Tx signal output through an optical Tx block 110.

The structures may be selectively applied based on a process difficulty or quality of the optical Tx signal or the optical Rx signal.

Figure 5:
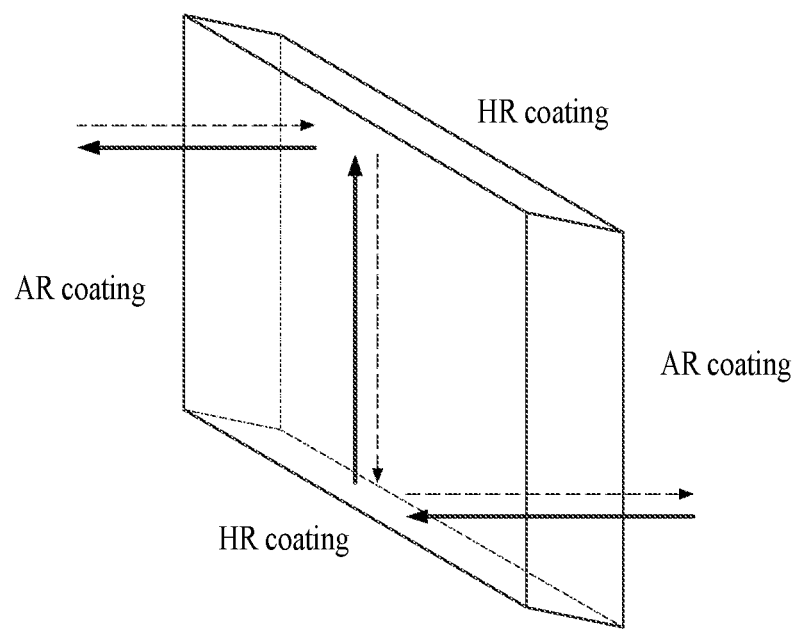
FIGS. 5 and 6 illustrate examples of an optical path controller and a bidirectional optical transceiver module including the optical path controller according to an example embodiment.
Figure 6:
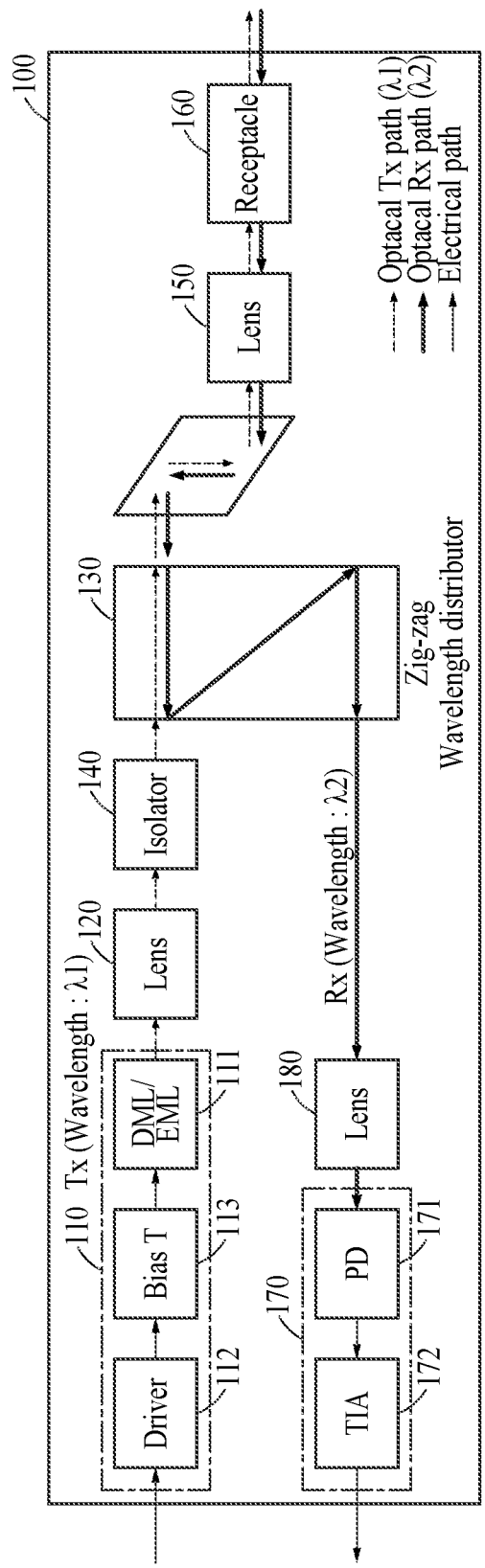

FIGS. 5 and 6 illustrate examples of an optical path controller and a bidirectional optical transceiver module including the optical path controller according to an example embodiment.

The wavelength distributor 130 provided in the bidirectional optical transceiver module 100 may change an optical path of an optical Tx signal or an optical Rx signal in a zigzagged manner. In this case, the input/output port of the bidirectional optical transceiver module 100 may be eccentric to one side.

To solve the above issue, referring to FIG. 5, the bidirectional optical transceiver module 100 may include the optical path controller of FIG. 5 at the rear end of the wavelength distributor 130. The optical path controller may use a device of a material through which an optical signal may be transmitted, such as, for example, glass. For example, referring to FIG. 5, the optical path controller may be manufactured in a shape of a parallelogram in which HR coating and AR coating are applied on the respective surfaces. Although FIG. 5 illustrates the optical path controller in a shape of a parallelogram column, it is provided as an example only. The shape and a size of the optical path controller may be determined based on a position of the input/output port of the bidirectional optical transceiver module 100 required.

Referring to FIG. 6, the bidirectional optical transceiver module 100 may solve the aforementioned eccentricity issue of the input/output port that may occur due to the wavelength distributor 130 using the zigzagged manner by moving the input/output port to a desired position through the optical path controller.

Figure 7:
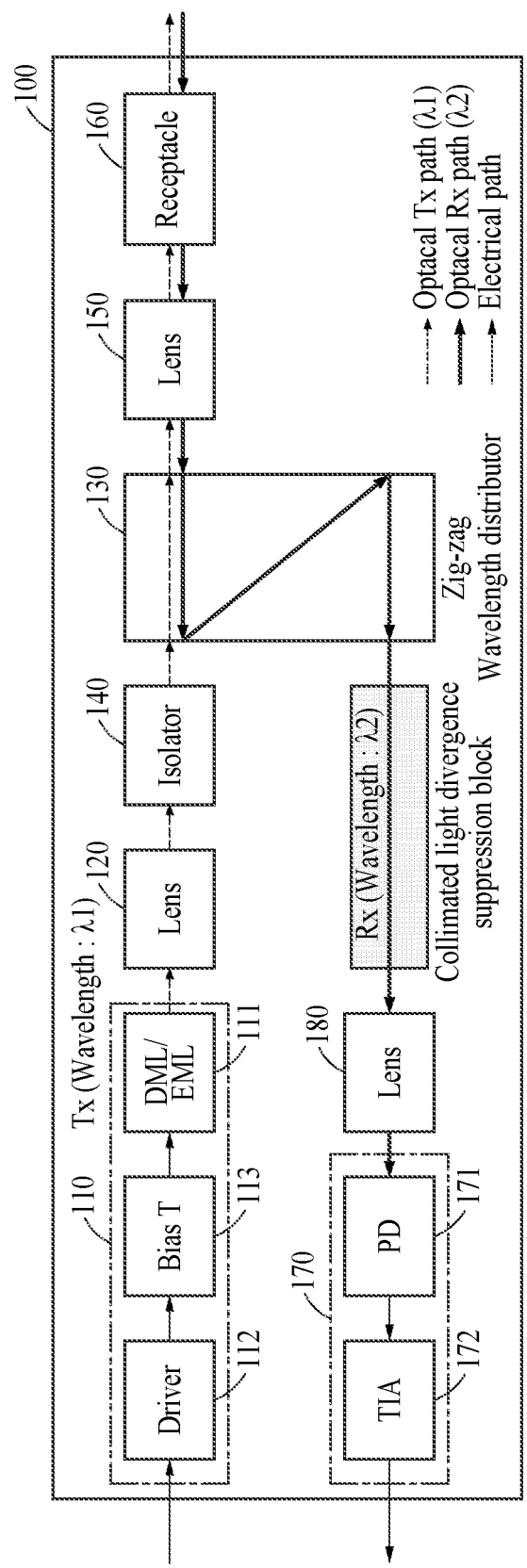
FIG. 7 illustrates an example of a bidirectional optical transceiver module including a collimated light divergence suppression block according to an example embodiment.

FIG. 7 illustrates an example of a bidirectional optical transceiver module including a collimated light divergence suppression block according to an example embodiment.

Referring to FIG. 7, in the case of the bidirectional optical transceiver module 100 in which the driver 112 configured to drive the light source 111 and the bias T 113 are embedded in the optical Tx block 110, a relatively large number of electronic devices are provided in the optical Tx block 110 compared to the optical Rx block 170 and an optical path between the second lens 180 provided at the rear end of the optical Rx block 170 and the wavelength distributor 130 becomes much longer. In particular, referring to FIG. 7, when an optical Rx signal is reflected by the wavelength distributor 130 and received at the optical Rx block 170 in a zigzagged form, an optical path of the wavelength distributor 130 may be added, which may lead to further increasing a difference in an optical path between an optical Tx signal and the optical Rx signal.

In this case, referring to FIG. 7, the bidirectional optical transceiver module 100 may solve a divergence issue of an optical signal that may occur due to the increased optical path by providing the collimated light divergence suppression block between the second lens 180 and the wavelength distributor 130.

Here, the collimated light divergence suppression block may be arranged at a position at which the optical path becomes longer depending on an internal device arrangement. The arranged collimated light divergence suppression block may perform the functionality of reducing the divergence effect of an optical signal according to the optical path compared to an optical signal that travels in the air.

Figure 8A:
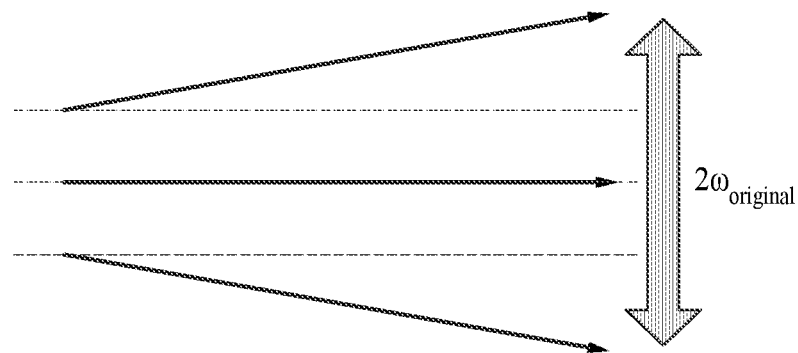
FIGS. 8A and 8B illustrate examples of an optical path controller according to an example embodiment.
Figure 8B:
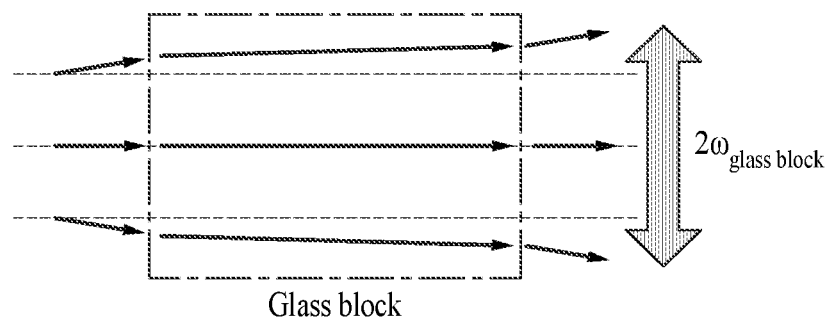

FIGS. 8A and 8B illustrate examples of an optical path controller according to an example embodiment.

The collimated light divergence suppression block proposed in FIG. 7 may include a transparent device having a higher refractive index than that of air. Although FIG. 7 illustrates the collimated light divergence suppression block in a shape of a rectangular parallelepiped, it is provided as an example only. The collimated light divergence suppression block may be manufactured in any shapes capable of reducing the divergence effect of an optical signal.

Compared to a case in which an optical signal travels in the air as shown in FIG. 8A, when the collimated light divergence suppression block is implemented as shown in FIG. 8B, the optical signal may be diverged in a relatively small range due to Snell's raw by high refractive index.

Accordingly, the collimated light divergence suppression block may improve the optical coupling efficiency and may also partially perform the functionality of an optical path controller as shown in FIG. 5 through a tilt function. The collimated light divergence suppression block may also be used as a physical interval adjustment function between an optical Tx function and an optical Rx function. Here, the collimated light divergence suppression block may acquire further enhanced performance since AR coating is applied on the incident surface and the exit surface of the optical signal.

While this specification includes details of a plurality of specific example embodiments, they should not be construed as limiting to any disclosure or scope of claims, but rather should be understood as description of features that may be peculiar to a specific example embodiment. Specific features described herein in the context of individual example embodiments may be implemented through combination in a single example embodiment. Conversely, various features described in the context of a single example embodiment may also be implemented individually or in any suitable sub-combinations in a plurality of example embodiments. Further, although features may operate through particular combination and be described as claimed at an initial stage, one or more features from a claimed combination may be excluded from the combination in some cases and the claimed combination may be changed with a sub-combination or modification thereof.

Likewise, although operations are illustrated in specific order, it should not be to understood that the operations should be performed in specific order or sequential order or all of the operations should be performed to achieve advantageous results. In a specific case, multitasking and parallel processing may be advantageous. Also, separation of various device components of the example embodiments should not be understood as requiring such separation in all the example embodiments and it should be understood that the aforementioned program components and devices may be integrated into a single software product or packaged into a plurality of software products.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A bidirectional optical transceiver module comprising:
an optical transmission (Tx) block comprising a light source formed on a top plane thereof and configured to output an optical Tx signal;
an optical reception (Rx) block provided in parallel to the optical Tx block at a predetermined interval therefrom and comprising a trans-impedance amplifier formed on a top plane thereof and a photodiode (PD) formed on a side plane thereof and configured to receive an optical Rx signal, wherein the PD is vertically attached on the side plane of the optical Rx block to thereby allow respective lenses used for the light source and the PD to be parallel to each other;
a wavelength distributor configured to change a travel path of the optical Tx signal;
an optical filter provided on a predetermined area of a first surface of the wavelength distributor adjacent to the optical Tx block or the optical Rx block and configured to transmit the optical Rx signal and to reflect the optical Tx signal;
a first lens provided between the optical Tx block and the wavelength distributor;
a second lens provided in parallel to the first lens between the optical Rx block and the wavelength distributor;
a third lens configured to output the optical Tx signal passing through the wavelength distributor to an outside and to output the optical Rx signal received from the outside to the wavelength distributor;
a collimated light divergence suppression block configured to improve optical coupling efficiency in a form of a rectangular parallelepiped with AR (Anti-Reflection) coating applied to incident and exit surfaces of the optical Tx signal or the optical Rx signal,
wherein the collimated light divergence suppression block is disposed on a longer optical path by comparing a length of an optical path between the wavelength distributor and the first lens and a length of an optical path between the wavelength distributor and the second lens,
wherein the optical Tx signal output from the light source of the optical Tx block is converted to a form of a collimated beam through the first lens, incident to the wavelength distributor, reflected by a reflector provided on a predetermined area of a second surface that faces the first surface of the wavelength distributor and then reflected again by the optical filter and output to the outside through the third lens, and
the optical Rx signal received from the outside is received at the wavelength distributor through the third lens, transmitted through the optical filter, and received at the PD of the optical Rx block through the second lens.

2. The bidirectional optical transceiver module of claim 1, wherein the optical Tx signal and the optical Rx signal have different wavelengths.

3. The bidirectional optical transceiver module of claim 1, wherein the collimated light divergence suppression block is configured to control an optical path of the optical Tx signal or the optical Rx signal through a tilt function.

4. The bidirectional optical transceiver module of claim 1, further comprising:
an electro-magnetic interference (EMI) suppression block configured to block effect by an electrical signal between the optical Tx block and the optical Rx block.

5. The bidirectional optical transceiver module of claim 1, further comprising:
an optical path controller configured to change optical paths of the optical Tx signal and the optical Rx signal at a rear end of the second surface of the wavelength distributor
wherein the optical path controller is in a form of a parallelogram in which two opposite surfaces are HR-coated and other two surfaces are AR-coated.

6. The bidirectional optical transceiver module of claim 5, wherein a shape, and a size of the optical path controller are determined based on a position of an input/output port of the bidirectional optical transceiver module.

7. A bidirectional optical transceiver module comprising:
an optical transmission (Tx) block comprising a light source formed on a top plane thereof and configured to output an optical Tx signal;
an optical reception (Rx) block provided in parallel to the optical Tx block at a predetermined interval therefrom and comprising a trans-impedance amplifier formed on a top plane thereof and a photodiode (PD) formed on atop plane thereof and configured to receive an optical Rx signal, wherein the PD is vertically attached on the side plane of the optical Rx block to thereby allow respective lenses used for the light source and the PD to be parallel to each other;
a wavelength distributor configured to change a travel path of the optical Tx signal;
an optical filter provided on a predetermined area of a first surface of the wavelength distributor adjacent to the optical Tx block or the optical Rx block and configured to transmit the optical Rx signal and to reflect the optical Tx signal;
a first lens provided between the optical Tx block and the wavelength distributor;
a second lens provided in parallel to the first lens between the optical Rx block and the wavelength distributor;
a third lens configured to output the optical Tx signal passing through the wavelength distributor to an outside and to output the optical Rx signal received from the outside to the wavelength distributor;
a collimated light divergence suppression block configured to improve optical coupling efficiency in a form of a rectangular parallelepiped with AR (Anti-Reflection) coating applied to incident and exit surfaces of the optical Tx signal or the optical Rx signal, wherein the collimated light divergence suppression block is disposed on a longer optical path by comparing a length of an optical path between the wavelength distributor and the first lens and a length of an optical path between the wavelength distributor and the second lens;
an electro-magnetic interference (EMI) suppression block configured to block effect by an electrical signal between the optical Tx block and the optical Rx block; and
an optical path controller configured to change optical paths of the optical Tx signal and the optical Rx signal at a rear end of a second surface of the wavelength distributor, wherein the optical path controller is in a form of a parallelogram in which two opposite surfaces are HR-coated and other two surfaces are AR-coated,
wherein the optical Tx signal output from the light source of the optical Tx block is converted to a form of a collimated beam through the first lens, incident to the wavelength distributor, reflected by a reflector provided on a predetermined area of the second surface that faces the first surface of the wavelength distributor and then reflected again by the optical filter and output to the outside through the third lens, and the optical Rx signal received from the outside is received at the wavelength distributor through the third lens, transmitted through the optical filter, and received at the PD of the optical Rx block through the second lens.

8. The bidirectional optical transceiver module of claim 7, wherein the optical Tx signal and the optical Rx signal have different wavelengths.

9. The bidirectional optical transceiver module of claim 7, wherein the collimated light divergence suppression block is provided between the second lens and the optical filter and comprises a transparent device having a higher refractive index than that of air.

10. The bidirectional optical transceiver module of claim 7, wherein the collimated light divergence suppression block is configured to control an optical path of the optical Rx signal through a tilt function.

11. The bidirectional optical transceiver module of claim 7, wherein a shape and a size of the optical path controller are determined based on a position of an input/output port of the bidirectional optical transceiver module.

\* \* \* \* \*